United States Patent
Loechelt et al.

(10) Patent No.: US 9,466,698 B2
(45) Date of Patent: Oct. 11, 2016

(54) ELECTRONIC DEVICE INCLUDING VERTICAL CONDUCTIVE REGIONS AND A PROCESS OF FORMING THE SAME

(71) Applicant: Semiconductor Components Industries, LLC, Phoenix, AZ (US)

(72) Inventors: Gary H. Loechelt, Tempe, AZ (US); Gordon M. Grivna, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 358 days.

(21) Appl. No.: 14/168,423

(22) Filed: Jan. 30, 2014

(65) Prior Publication Data

US 2014/0264574 A1    Sep. 18, 2014

Related U.S. Application Data

(60) Provisional application No. 61/794,299, filed on Mar. 15, 2013.

(51) Int. Cl.

| | | |
|---|---|---|
| H01L 29/66 | (2006.01) | |
| H01L 29/417 | (2006.01) | |
| H01L 29/423 | (2006.01) | |
| H01L 29/78 | (2006.01) | |
| H01L 21/8234 | (2006.01) | |
| H01L 27/088 | (2006.01) | |
| H01L 29/40 | (2006.01) | |
| H01L 29/06 | (2006.01) | |
| H01L 29/10 | (2006.01) | |

(52) U.S. Cl.
CPC . *H01L 29/66659* (2013.01); *H01L 21/823475* (2013.01); *H01L 27/088* (2013.01); *H01L 29/4175* (2013.01); *H01L 29/42376* (2013.01); *H01L 29/66689* (2013.01); *H01L 29/7824* (2013.01); *H01L 29/7835* (2013.01); *H01L 29/063* (2013.01); *H01L 29/1083* (2013.01); *H01L 29/1095* (2013.01); *H01L 29/402* (2013.01)

(58) Field of Classification Search
CPC .................... H01L 29/7827; H01L 29/66666
See application file for complete search history.

(56) References Cited

U.S. PATENT DOCUMENTS

| | | | | |
|---|---|---|---|---|
| 4,454,523 A | * | 6/1984 | Hill | 257/264 |
| 5,283,460 A | * | 2/1994 | Mita | 257/432 |
| 5,689,126 A | * | 11/1997 | Takaishi | 257/306 |
| 5,986,301 A | * | 11/1999 | Fukushima et al. | 257/306 |
| 6,251,734 B1 | * | 6/2001 | Grivna et al. | 438/296 |
| 6,498,069 B1 | * | 12/2002 | Grivna | 438/386 |
| 6,943,428 B2 | * | 9/2005 | Furukawa et al. | 257/587 |
| 7,132,720 B2 | * | 11/2006 | Yoshizawa et al. | 257/409 |
| 7,282,765 B2 | * | 10/2007 | Xu et al. | 257/343 |
| 7,868,379 B2 | * | 1/2011 | Loechelt | 257/328 |

(Continued)

*Primary Examiner* — Matthew Landau
*Assistant Examiner* — Grant Withers
(74) *Attorney, Agent, or Firm* — Abel Law Group, LLP

(57) ABSTRACT

An electronic device can include different vertical conductive structures that can be formed at different times. The vertical conductive structures can have the same or different shapes. In an embodiment, an insulating spacer can be used to help electrically insulate a particular vertical conductive structure from another part of the workpiece, and an insulating spacer may not be used to electrically isolate a different vertical conductive structure. The vertical conductive structures can be tailored for particular electrical considerations or to a process flow when formation of other electronic components may also be formed within either or both of the particular vertical conductive structures.

17 Claims, 11 Drawing Sheets

(56) References Cited

U.S. PATENT DOCUMENTS

| | | | |
|---|---|---|---|
| 7,902,017 B2 | 3/2011 | Loechelt | |
| 7,989,857 B2 * | 8/2011 | Loechelt | 257/288 |
| 8,076,716 B2 | 12/2011 | Loechelt | |
| 8,202,775 B2 | 6/2012 | Loechelt | |
| 8,519,474 B2 | 8/2013 | Loechelt | |
| 8,723,238 B1 * | 5/2014 | Padmanabhan et al. | 257/288 |
| 8,829,607 B1 * | 9/2014 | Hsieh | 257/330 |
| RE45,365 E * | 2/2015 | Loechelt et al. | 257/339 |
| 8,981,467 B2 * | 3/2015 | Park | 257/330 |
| 2001/0001484 A1 * | 5/2001 | Friedrichs et al. | 257/77 |
| 2001/0044182 A1 * | 11/2001 | Sakoh et al. | 438/255 |
| 2002/0036305 A1 * | 3/2002 | Sameshima | 257/295 |
| 2002/0153614 A1 * | 10/2002 | Ema et al. | 257/773 |
| 2004/0099898 A1 * | 5/2004 | Grivna et al. | 257/309 |
| 2004/0106264 A1 * | 6/2004 | Loechelt | 438/312 |
| 2005/0023701 A1 * | 2/2005 | Kajita et al. | 257/774 |
| 2006/0065917 A1 * | 3/2006 | Kajita et al. | 257/295 |
| 2006/0124960 A1 * | 6/2006 | Hirose et al. | 257/189 |
| 2006/0170020 A1 * | 8/2006 | Ohta et al. | 257/295 |
| 2006/0180857 A1 * | 8/2006 | Loechelt et al. | 257/341 |
| 2007/0034947 A1 * | 2/2007 | Loechelt et al. | 257/341 |
| 2007/0278592 A1 * | 12/2007 | Tu et al. | 257/374 |
| 2008/0081440 A1 * | 4/2008 | Parsey et al. | 438/477 |
| 2009/0079001 A1 * | 3/2009 | Salih et al. | 257/355 |
| 2009/0095998 A1 * | 4/2009 | Ho et al. | 257/301 |
| 2009/0108342 A1 * | 4/2009 | Wang et al. | 257/330 |
| 2009/0108343 A1 * | 4/2009 | Nemtsev et al. | 257/330 |
| 2009/0194844 A1 * | 8/2009 | Richter | 257/532 |
| 2009/0283776 A1 * | 11/2009 | Iwamuro | 257/76 |
| 2010/0032761 A1 * | 2/2010 | Ding et al. | 257/350 |
| 2010/0120227 A1 * | 5/2010 | Grivna et al. | 438/462 |
| 2010/0151646 A1 * | 6/2010 | Loechelt | 438/286 |
| 2010/0187696 A1 * | 7/2010 | Grivna | 257/773 |
| 2010/0219463 A1 * | 9/2010 | Cheng et al. | 257/329 |
| 2010/0327344 A1 * | 12/2010 | Paul et al. | 257/330 |
| 2010/0327350 A1 * | 12/2010 | Loechelt et al. | 257/341 |
| 2011/0193160 A1 * | 8/2011 | Loechelt et al. | 257/337 |
| 2011/0193177 A1 * | 8/2011 | Loechelt | 257/402 |
| 2012/0326227 A1 * | 12/2012 | Burke et al. | 257/330 |
| 2013/0153992 A1 * | 6/2013 | Loechelt | 257/330 |
| 2013/0187196 A1 * | 7/2013 | Kadow | 257/140 |
| 2014/0015038 A1 * | 1/2014 | Ng et al. | 257/330 |
| 2014/0070375 A1 * | 3/2014 | Grivna | 257/621 |
| 2014/0097489 A1 * | 4/2014 | Roig-Guitart et al. | 257/330 |
| 2014/0197483 A1 * | 7/2014 | Burke et al. | 257/330 |
| 2014/0252430 A1 * | 9/2014 | Loechelt et al. | 257/288 |
| 2014/0252466 A1 * | 9/2014 | Loechelt | 257/331 |
| 2014/0252473 A1 * | 9/2014 | Loechelt et al. | 257/342 |
| 2014/0252484 A1 * | 9/2014 | Loechelt et al. | 257/355 |
| 2014/0264523 A1 * | 9/2014 | Loechelt et al. | 257/301 |
| 2014/0264565 A1 * | 9/2014 | Padmanabhan et al. | 257/330 |
| 2014/0264574 A1 * | 9/2014 | Loechelt et al. | 257/334 |
| 2014/0291753 A1 * | 10/2014 | Hsieh | 257/330 |
| 2014/0319603 A1 * | 10/2014 | Kawaguchi | 257/330 |
| 2014/0332882 A1 * | 11/2014 | Lui et al. | 257/334 |
| 2014/0353747 A1 * | 12/2014 | Cheng | 257/334 |
| 2015/0021682 A1 * | 1/2015 | Bobde et al. | 257/330 |
| 2015/0032960 A1 * | 1/2015 | Dong | 711/118 |
| 2015/0041960 A1 * | 2/2015 | Morii et al. | 257/621 |
| 2015/0069502 A1 * | 3/2015 | Munetaka et al. | 257/329 |
| 2015/0079745 A1 * | 3/2015 | Fukui et al. | 438/268 |
| 2015/0079779 A1 * | 3/2015 | Nishi et al. | 438/589 |

* cited by examiner

ELECTRONIC DEVICE INCLUDING VERTICAL CONDUCTIVE REGIONS AND A PROCESS OF FORMING THE SAME

CROSS-REFERENCE TO RELATED APPLICATION

This application claims priority under 35 U.S.C. §119(e) to U.S. Patent Application No. 61/794,299 entitled "Electronic Device Including Vertical Conductive Regions and a Process of Forming the Same," by Loechelt et al., filed Mar. 15, 2013, which is assigned to the current assignee hereof and incorporated herein by reference in its entirety.

FIELD OF THE DISCLOSURE

The present disclosure relates to electronic devices and processes of forming electronic devices, and more particularly to, electronic devices including vertical conductive regions and processes of forming the same.

RELATED ART

An insulated gate field-effect transistor (IGFET) is a common type of transistor that can be used in a power switching circuit. An IGFET includes a source region, a drain region, a channel region extending between the source and drain regions, and a gate structure provided adjacent to the channel region. The gate structure includes a gate electrode layer disposed adjacent to and separated from the channel region by a thin dielectric layer.

In a particular application, a pair of power transistors can be used to allow an output terminal of a switching circuit to switch between two different voltages. The output can be connected to a source of a high-side power transistor and to a drain of a low-side power transistor. In a particular physical embodiment, the high-side power transistor and the low-side power transistor may be on the same die and interconnected to each other. Further improvements with interconnects between the high-side and low-side power transistors and process integration related to such interconnects is desired.

BRIEF DESCRIPTION OF THE DRAWINGS

Embodiments are illustrated by way of example and are not limited in the accompanying figures.

Figure 1:
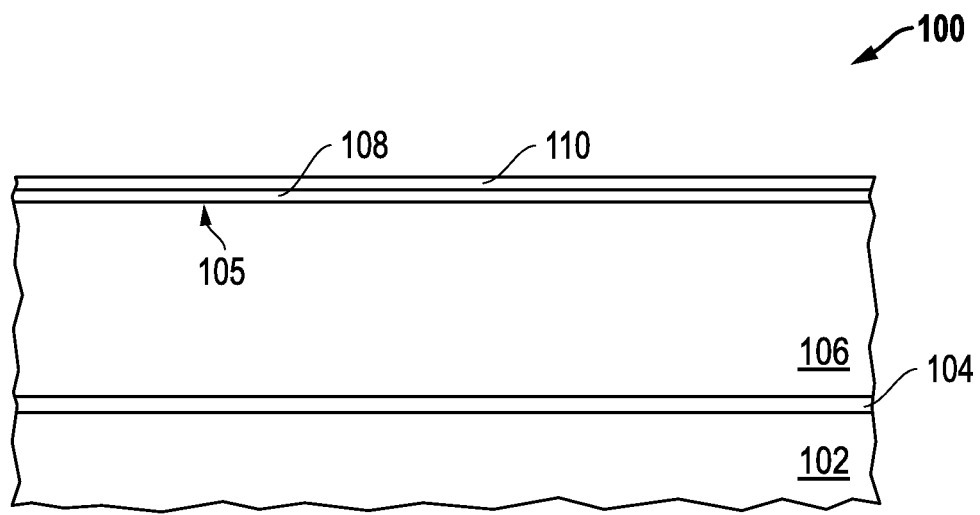
FIG. 1 includes an illustration of a cross-sectional view of a portion of a workpiece including a buried conductive region, a buried insulating layer, a semiconductor layer, a pad layer, and a stopping layer.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

As used herein, the terms "horizontally-oriented" and "vertically-oriented," with respect to a region or structure, refer to the principal direction in which current flows through such region or structure. More specifically, current can flow through a region or structure in a vertical direction, a horizontal direction, or a combination of vertical and horizontal directions. If current flows through a region or structure in a vertical direction or in a combination of directions, wherein the vertical component is greater than the horizontal component, such a region or structure will be referred to as vertically oriented. Similarly, if current flows through a region or structure in a horizontal direction or in a combination of directions, wherein the horizontal component is greater than the vertical component, such a region or structure will be referred to as horizontally oriented.

The term "metal" or any of its variants is intended to refer to a material that includes an element that is within any of the Groups 1 to 12, within Groups 13 to 16, an element that is along and below a line defined by atomic numbers 13 (Al), 31 (Ga), 50 (Sn), 51 (Sb), and 84 (Po). Metal does not include Si or Ge.

The term "normal operation" and "normal operating state" refer to conditions under which an electronic component or device is designed to operate. The conditions may be obtained from a data sheet or other information regarding voltages, currents, capacitance, resistance, or other electrical parameters. Thus, normal operation does not include operating an electrical component or device well beyond its design limits.

The term "power transistor" is intended to mean a transistor that is designed to normally operate with at least a 10 V difference maintained between the source and drain or emitter and collector of the transistor when the transistor is in an off-state. For example, when the transistor is in an off-state, a 10 V may be maintained between the source and drain without a junction breakdown or other undesired condition occurring.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

Group numbers corresponding to columns within the Periodic Table of Elements based on the IUPAC Periodic Table of Elements, version dated Jan. 21, 2011.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

Transistor structures for different power transistors can be electrically connected to each other and a buried conductive region using vertical conductive regions. The vertical conductive regions may be substantially identical or may be different. In an embodiment, one type of vertical conductive regions may be used for one of the power transistors, and another type of vertical conductive regions may be used for another of the power transistors. The different vertical conductive regions can be used to better tailor the vertical conductive regions to particular components being formed within the electronic device. Even with electronic components that are substantially identical, different types of vertical conductive structures within or through a semiconductor layer may be used due to differences in voltages, electrical fields, current, current densities, different elevations at which electrical connections are made, or the like. Different types of vertical conductive structures can allow for more flexibility for electronic, process, and physical designs of electronic devices incorporating the different vertical conductive structures. The concepts are better understood after reading the specification with the accompanying figures, which merely illustrate particular embodiments, and do not limit the scope of the present invention.

In non-limiting embodiments described below, the electronic device can include a switching circuit, such as a Buck converter. A high-side transistor can have a current-carrying electrode coupled to a power supply terminal, such as $V_D$, and another current-carrying terminal coupled to an output terminal. A low-side transistor can have a current-carrying electrode coupled to another power supply terminal, such as $V_S$, and another current-carrying terminal coupled to the output terminal. Control electrodes for the high-side and low-side transistors can be coupled to a control unit. Based on the voltage needed to be provided at the output terminal, the control unit can send appropriate signals to the transistors. For example, if the output node is to be at substantially $V_D$, the high-side transistor is enabled, and the low-side transistor is disabled. If the output node is to be at substantially $V_S$, the high-side transistor is disabled, and the low-side transistor is enabled. In a particular embodiment, the high-side and low-side transistors can be power transistors that are part of power switching circuit for a high-frequency voltage regulator.

A transistor in a circuit schematic can be physically implemented as a single transistor structure or as a plurality of transistor structures. In a particular implementation, the plurality of transistor structures may have their drain regions or collector regions electrically connected to each other, their gate electrodes or base regions electrically connected to each other, and their source regions or emitter regions electrically connected to each other. The description below addresses a high-side power transistor and a low-side power transistor. Each of transistors can be described with respect to transistor structures even though only a single transistor is illustrated or used in an embodiment. Thus, a reference to transistor structures also can also cover a single transistor structure unless explicitly stated to the contrary. The term "HS transistor structures" refers to one or more transistor structures that are at least part of a high-side power transistor, and the term "LS transistor structures" revers to one or more transistor structures that are at least part of a low-side power transistor.

FIG. 1 includes an illustration of a cross-sectional view of a portion of a workpiece 100 that includes a buried conductive region 102, a buried insulating layer 104, a semiconductor layer 106, a pad layer 108, and a stopping layer 110 (e.g., a polish-stop layer or an etch-stop layer). The buried conductive region 102 can include a Group 14 element (i.e., carbon, silicon, germanium, or any combination thereof) and can be heavily n-type or p-type doped. For the purposes of this specification, heavily doped is intended to mean a peak dopant concentration of at least $1 \times 10^{19}$ atoms/cm$^3$, and lightly doped is intended to mean a peak dopant concentration of less than $1 \times 10^{19}$ atoms/cm$^3$. The buried conductive region 102 can be a portion of a heavily doped substrate (e.g., a heavily n-type doped wafer) or may be a buried doped region disposed over a substrate of opposite conductivity type or over another buried insulating layer (not illustrated) that is disposed between a substrate and the buried conductive region 102. In an embodiment, the buried conductive region 102 is heavily doped with an n-type dopant, such as phosphorus, arsenic, antimony, or any combination thereof. In a particular embodiment, the buried conductive region 102 includes arsenic or antimony if diffusion of the buried conductive region 102 is to be kept low, and in a particular embodiment, the buried conductive region 102 includes antimony to reduce the level of autodoping (as compared to arsenic) during formation of a subsequently-formed semiconductor layer. The buried conductive region 102 will be used to electrically connect the source of the high-side transistor and the drain of the low-side transistor together and be part of an output node for the electronic device.

The buried insulating layer 104 is disposed over the buried conductive region 102. During normal operation, the buried insulating layer 104 helps to isolate the voltage on the buried conductive region 102 from portions of the semiconductor layer 106. The buried insulating layer 104 can include an oxide, a nitride, or an oxynitride. The buried insulating layer 104 can include a single film or a plurality of films having the same or different compositions. In an embodiment, the buried insulating layer 104 can have a thickness of at least approximately 0.2 micron, and in a further embodiment, the buried insulating layer 104 may have a thickness no greater than approximately 5.0 microns. In a particular embodiment, the buried insulating layer 104 has a thickness in a range of approximately 0.5 micron to approximately 0.9 micron.

The semiconductor layer 106 is disposed over the buried insulating layer 104 and has a primary surface 105 where the transistor structures and other electronic components (not illustrated) will be subsequently formed. The semiconductor layer 106 can include a Group 14 element and any of the dopants as described with respect to the buried conductive region 102 or dopants of the opposite conductivity type. In an embodiment, the semiconductor layer 106 is a lightly doped n-type or p-type epitaxial silicon layer having a thickness in a range of approximately 0.2 micron to approximately 5.0 microns, and a doping concentration no greater than approximately $1 \times 10^{17}$ atoms/cm$^3$, and in another embodiment, a doping concentration of at least approximately $1 \times 10^{14}$ atoms/cm$^3$. The semiconductor layer 106 may be disposed over all of the workpiece 100. The dopant concentration within the semiconductor layer 106 as formed or before selectively doping regions within the semiconductor layer 106 will be referred to as the background dopant concentration.

The pad layer 108 and the stopping layer 110 can be sequentially formed over the semiconductor layer 106 using a thermal growth technique, a deposition technique, or a combination thereof. Each of the pad layer 108 and the stopping layer 110 can include an oxide, a nitride, an oxynitride, or any combination thereof. In an embodiment, the pad layer 108 has a different composition as compared to the stopping layer 110. In a particular embodiment, the pad layer 108 includes an oxide, and the stopping layer 110 includes a nitride.

Figure 2:
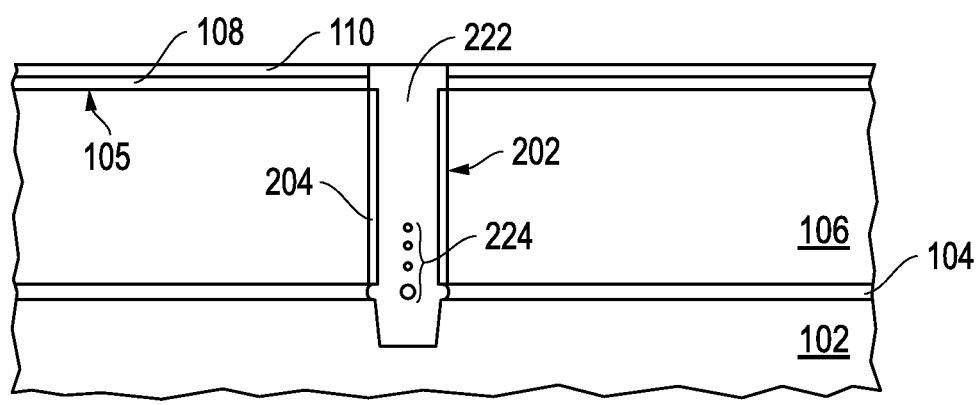
FIG. 2 includes an illustration of a cross-sectional view of the workpiece of FIG. 1 after patterning the layer to define trenches and forming conductive plugs.

FIG. 2 illustrates the workpiece after layers are patterned to define trenches 202 and after forming insulating spacers 204 and vertical conductive plugs 222, in which one of each of the trenches 202, insulating spacers 204 and vertical conductive structures 222 is illustrated in FIG. 2. Portions of the workpiece in which HS transistor structures are being formed can have the trenches 202, insulating spacers 204, and vertical conductive structures 222, and portions of workpiece in which LS transistor structures are being formed may not have the trenches 202, insulating spacers 204, and conductive plugs 222.

A patterned masking layer (not illustrated) is formed over the stopping layer 110. In a particular embodiment, exposed portions of the pad layer 108, stopping layer 110, the semiconductor layer 106, and the buried insulating layer 104 are removed to define initial portions of the trenches 202. Anisotropic etching techniques are used to form portions of the trenches 202 at this point in processing. In an embodiment, substantially none of the buried insulating layer 104 is removed, and in another embodiment, only part or substantially all of the thickness of the buried insulating layer 104 disposed under the openings is removed. In a particular embodiment, the width of each of the trenches 202 is at least approximately 0.05 micron or approximately 0.1 micron, and in another particular embodiment, the width of each of the trenches 202 is no greater than approximately 3.0 microns, approximately 2.5 microns, or approximately 1 micron. The patterned masking layer can be removed after forming the trenches 202. In a particular embodiment, an etchant can be used to remove any residual material that may have formed within the trenches 202. Such an etchant may isotropically etch a portion the buried insulating layer 104 and undercut a portion of the semiconductor layer 106. In another embodiment, the etching may not be performed.

Insulating spacers 204 can be formed within the trenches 202. The insulating spacers 204, which may also be referred to as insulating liners, can help to electrically insulate the semiconductor layer 106 from the conductive plugs 222 that are subsequently formed within the trenches 202. In the embodiment as illustrated, a thermal oxidation can be performed to form the insulating spacer 204. In another embodiment (not illustrated), an insulating layer can be conformally deposited and anisotropically etched to form the insulating spacers. The insulating spacers 204 have a width in a range of approximately 20 nm to approximately 200 nm.

Before forming the conductive plugs 222, any remaining insulating material, such as oxide, along the bottoms of the trenches 202 (as illustrated in FIG. 2) can be removed, and the trenches 202 can be extended into the buried conductive region 102 to form the trench extensions into the buried conductive region 102. In an embodiment, the trench extensions may be at least approximately 0.2 micron into the buried conductive region 102, and in another embodiment, the trench extensions may be at least approximately 0.3 micron. In a further embodiment, the trench extensions may be no greater than approximately 5.0 micron, and in still a further embodiment no greater than approximately 2.0 microns. In another embodiment, the trench extensions may be deeper or shallower than described above. The removal of the insulating material and forming the trench extensions can be performed using an anisotropic etch technique.

A conductive layer is formed over the stopping layer 110 and within the trenches 202, and, in a particular embodiment, the conductive layer substantially fills the trenches 202. The conductive layer can be polycrystalline and include a metal-containing or semiconductor-containing material. In an embodiment, the conductive layer can include a heavily doped semiconductor material, such as amorphous silicon or polysilicon. In another embodiment, the conductive layer includes a plurality of films, such as an adhesion film, a barrier film, and a conductive fill material. In a particular embodiment, the adhesion film can include a refractory metal, such as titanium, tantalum, tungsten, or the like; the barrier film can include a refractory metal nitride, such as titanium nitride, tantalum nitride, tungsten nitride, or the like, or a refractory metal-semiconductor-nitride, such as TaSiN; and the conductive fill material can include tungsten or tungsten silicide. In a more particular embodiment, the conductive layer can include Ti/TiN/W. The selection of the number of films and composition(s) of those film(s) depends on electrical performance, the temperature of a subsequent heat cycle, another criterion, or any combination thereof. Refractory metals and refractory metal-containing compounds can withstand high temperatures (e.g., melting points of the refractory metals can be at least 1400° C.), may be conformally deposited, and have a lower bulk resistivity than heavily doped n-type silicon. After reading this specification, skilled artisans will be able to determine the composition of the conductive layer to meet their needs or desires for a particular application. During the formation of the conductive layer, voids 224 may form within conductive plugs 222 along a centerline of the trenches 202. The voids 224 may or may not be substantially the same size. In the embodiment as illustrated, the void formed at an elevation corresponding to the buried insulating layer 104 may be larger than the voids formed at higher elevations, such as laterally adjacent to the semiconductor layer 106. The voids 224 may be present but are not illustrated in subsequent figures.

A portion of the conductive layer that is disposed over the stopping layer 110 is removed to form the conductive plugs 222 within the trenches 202, as illustrated in the embodiment of FIG. 2. A continued etch or other removal operation can be used to recess the conductive plugs 222 further into the trenches 202, as illustrated in FIG. 2, if needed or desired.

In subsequent figures, two portions of the workpiece are illustrated to improve understanding of how subsequent processing operations affect different portions of the workpiece. The upper illustration (closer to the top of the drawing sheet) corresponds to portions of the workpiece where HS transistors structures are being formed, and the lower illustration (closer to the bottom of the drawing sheet) corresponds to portions of the workpiece where LS transistors structures are being formed.

Figure 3:
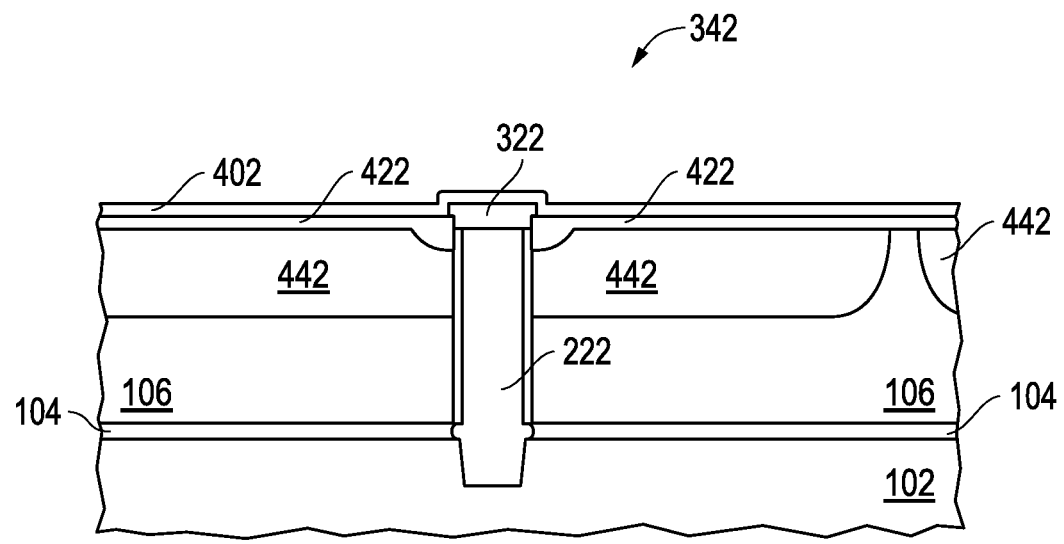
FIG. 3 includes illustrations of cross-sectional views of the workpiece of FIG. 2 after forming vertical conductive structures, a dielectric layer, horizontally-oriented doped regions, and resurf regions.
Figure 3:
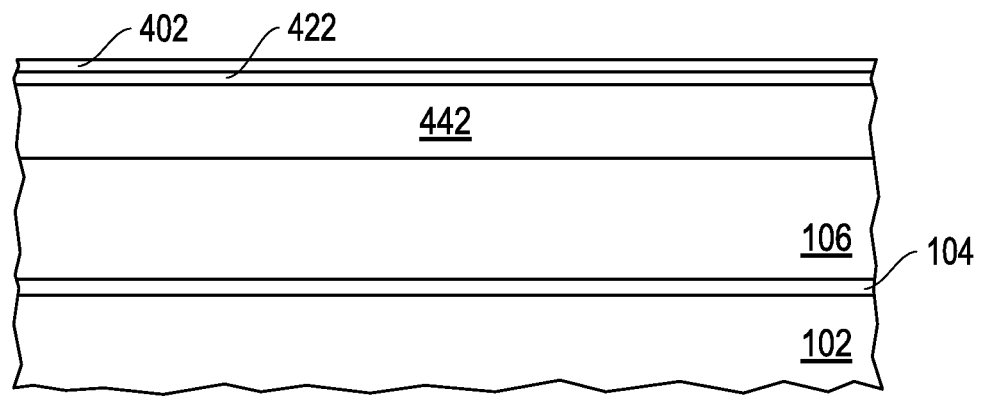

Referring to the upper illustration in FIG. 3, while portions of the stopping layer 110 are present (not illustrated in FIG. 3), exposed portions the pad layer are etched and undercut part of the stopping layer 110 to expose portions of the semiconductor layer 106 near the trenches 202. At this point in the embodiment as illustrated on FIG. 3, an additional etch of the trench fill material may be performed exposing the upper surface of the insulating spacers 204. Exposed portions of the insulating spacers 204 are etched, and remaining portions of the stopping layer 110 are then removed. Conductive plugs 322 are formed within the trenches and help to electrically connect the conductive plugs 222 to doped regions that will be subsequently formed within the semiconductor layer 106. The conductive plugs 322 can be formed using any of the materials and methods of formation for the conductive plugs 222, except that the conductive plugs 322 may or may not be recessed within the trenches 202. The conductive plugs 222 and 322 may include the same material or different materials and may be formed using the same technique or different techniques. The combinations of the conductive plugs 222 and 322 can form vertical conductive structures 342. In subsequent figures, the vertical conductive structures 342 are used to refer to combinations of the conductive plugs 222 and 322. In an alternative embodiment in which the buried insulating layer 104 is not used (not illustrated), the vertical conductive structures 342 can be in a form of doped regions within the semiconductor layer 106 that can be formed using one or more ion implantations. Thus, vertical conductive regions can be vertical conductive structures, vertical doped regions, or any combination thereof. Remaining portions of the pad layer 108 and the stopping layer 110 may be removed from the workpiece at this point in the process.

Referring to both illustrations in FIG. 3, a dielectric layer 402, horizontally-oriented doped regions 422, and resurf regions 442 are formed. The horizontally-oriented doped regions 422 can be at least parts of drain regions of transistor structures. In a normal operating state, the charge carriers (for example, electrons) or current flows through the horizontally-oriented doped regions 422 principally in a horizontal direction. The horizontally-oriented doped regions 422 can have a dopant concentration of less than approximately $1 \times 10^{19}$ atoms/cm$^3$ and at least approximately $1 \times 10^{16}$ atoms/cm$^3$ and a depth in one embodiment of less than approximately 0.9 micron, and in another embodiment of less than approximately 0.5 micron. In a particular embodiment, the horizontally-oriented doped regions 422 are n-type doped.

The resurf regions 442 can help keep more current flowing through the horizontally-oriented doped regions 422 instead of into the semiconductor layer 106 underlying the horizontally-oriented doped regions 422. Referring to the upper illustration in FIG. 3, resurf regions 442 may not extend under a portion of the horizontally-oriented doped region 422 where drain contacts for the high-side transistors will be formed. The resurf regions 442 may have a dopant concentration of no greater than approximately $5 \times 10^{17}$ atoms/cm$^3$ and at least approximately $1 \times 10^{16}$ atoms/cm$^3$, and a depth in one embodiment of less than approximately 1.5 microns, and in another embodiment of less than approximately 1.2 microns. The peak concentration of the resurf regions 442 may be in a range of approximately 0.5 micron to approximately 0.9 micron below the primary surface 105. In a particular embodiment, the resurf regions 442 are p-type doped.

In an embodiment, the horizontally-oriented doped regions 422 can be formed before the resurf regions 442. In another embodiment, the horizontally-oriented doped regions 422 can be formed after the resurf regions 442.

Figure 4:
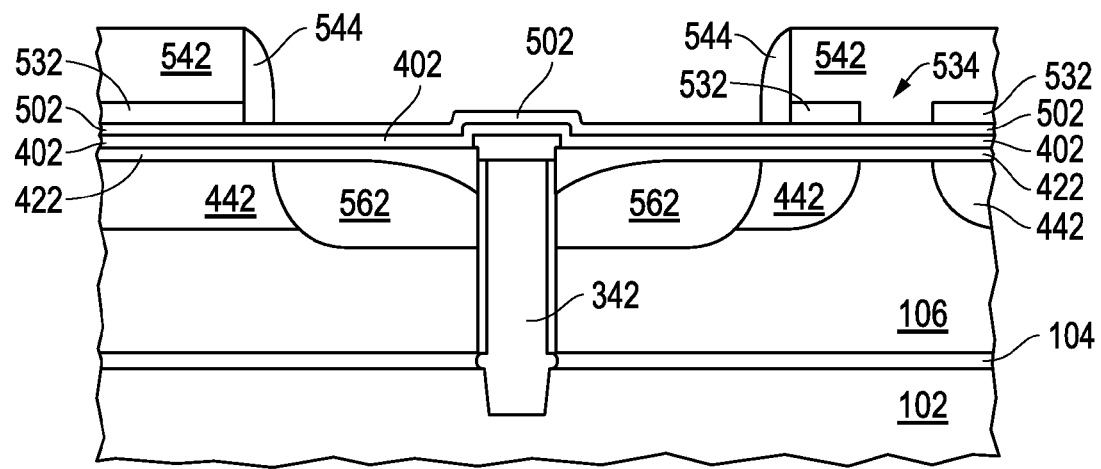
FIG. 4 includes illustrations of cross-sectional views of the workpiece of FIG. 3 after forming insulating members, a patterned conductive layer, insulating sidewall spacers, and deep body doped regions.
Figure 4:
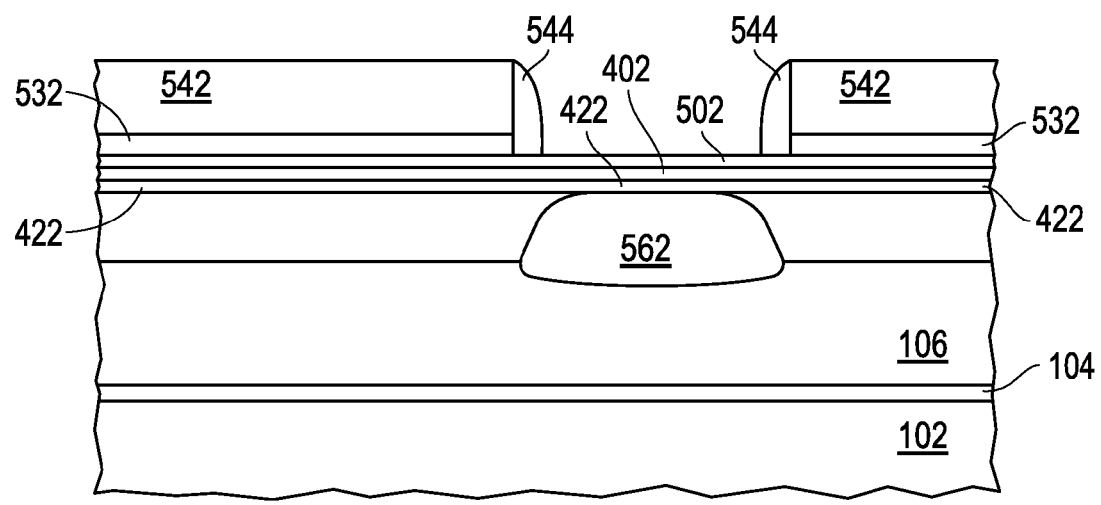

FIG. 4 includes illustrations after forming an insulating layer 502, conductive electrodes 532, insulating members 542, insulating spacers 544, and deep body doped regions 562. The insulating layer 502 can formed using a thermal growth technique, a deposition technique, or a combination thereof. The insulating layer 502 can include an oxide, a nitride, an oxynitride, or any combination thereof. In an embodiment, the insulating layer 502 includes a nitride and has a thickness in a range of approximately 20 nm to approximately 90 nm. A conductive layer for the conductive electrodes 532 is deposited over the insulating layer 502. The conductive layer includes a conductive material or may be made conductive, for example, by doping. More particularly, the conductive layer can include a doped semiconductor material (e.g., heavily doped amorphous silicon, polysilicon, etc.), a metal-containing material (a refractory metal, a refractory metal nitride, a refractory metal silicide, etc.), or any combination thereof. The conductive layer has a thickness in a range of approximately 0.05 micron to approximately 0.5 micron. The conductive layer is patterned to define openings 534 where drain contacts for the HS transistors structures are being formed.

An insulating layer for the insulating members 542 is deposited over the patterned conductive layer for the conductive electrodes 532 and within the openings 534. The insulating layer can include one or more insulating films. The insulating layer can include an oxide, a nitride, any oxynitride, or an organic dielectric. The insulating layer has a thickness in a range of approximately 0.2 micron to approximately 2.0 microns. A masking layer (not illustrated) is formed over the insulating layer and patterned to define openings where the transistor structures are being formed. Portions of the insulating layer are patterned to form the insulating members 542, and the masking features are removed. Exposed portions of the patterned conductive layer are removed to form the conductive electrodes 532 that help to reduce drain-to-gate capacitance within the transistor structures. The insulating spacers 544 are formed along the sidewalls of the patterned conductive layer 532 and the insulating members 542. In a particular embodiment, the insulating spacers 544 include a nitride and are formed by depositing a nitride layer to a thickness in a range of approximately 20 nm to approximately 90 nm and anisotropically etching the nitride layer to form the insulating spacers 544. Openings defined by the insulating spacers 544 are disposed over portions of the semiconductor layer 106 where deep body doped regions 562 and source and channel regions will be formed.

The deep body doped regions 562 can provide alternative paths during avalanche breakdown between the drain regions of the transistor structures and the deep body doped regions 562 as opposed to avalanche breakdown between the drain regions and subsequently-formed channel regions. In an embodiment, the peak concentration of the deep body doped regions 562 is at least approximately 0.1 micron deeper than the peak concentration of the channel region, and in another embodiment, the peak concentration of the deep body doped regions 562 is no greater than approximately 0.9 micron deeper than the peak concentration of the channel region. In a further embodiment, the peak concentration of the deep body doped regions 562 is in a range of approximately 0.6 micron to approximately 1.1 microns below the primary surface 105. The deep body doped regions 562 can be formed using a single implant or a combination of implants. The deep body doped regions 562 may or may not contact the buried insulating layer 104. For a single implant or for the implant (of a combination of implants) having the lowest projected range, the dose can be in a range of approximately $5\times10^{13}$ ions/cm$^2$ to approximately $5\times10^{14}$ ions/cm$^2$.

Figure 5:
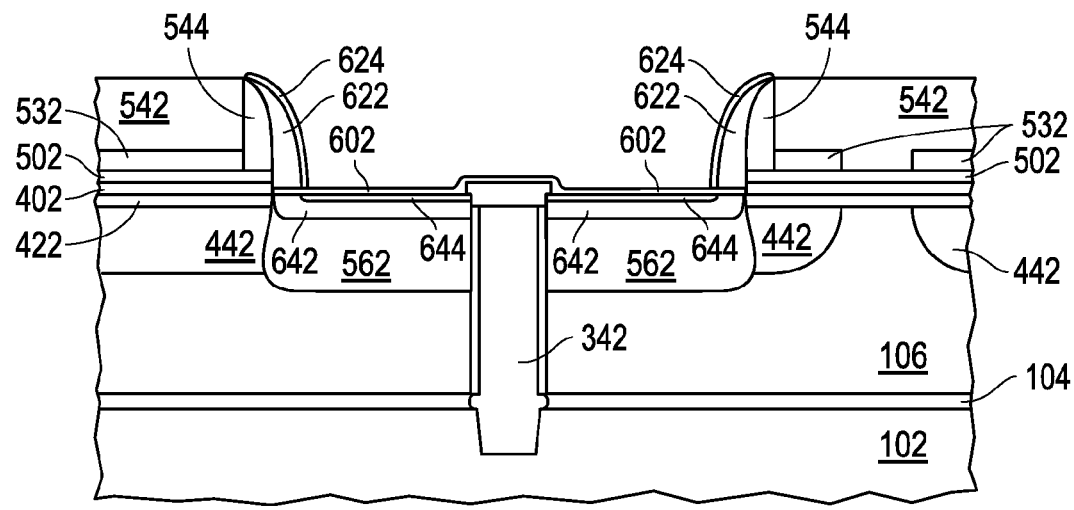
FIG. 5 includes illustrations of cross-sectional views of the workpiece of FIG. 4 after forming body regions, gate electrodes, an insulating layer, and source regions.
Figure 5:
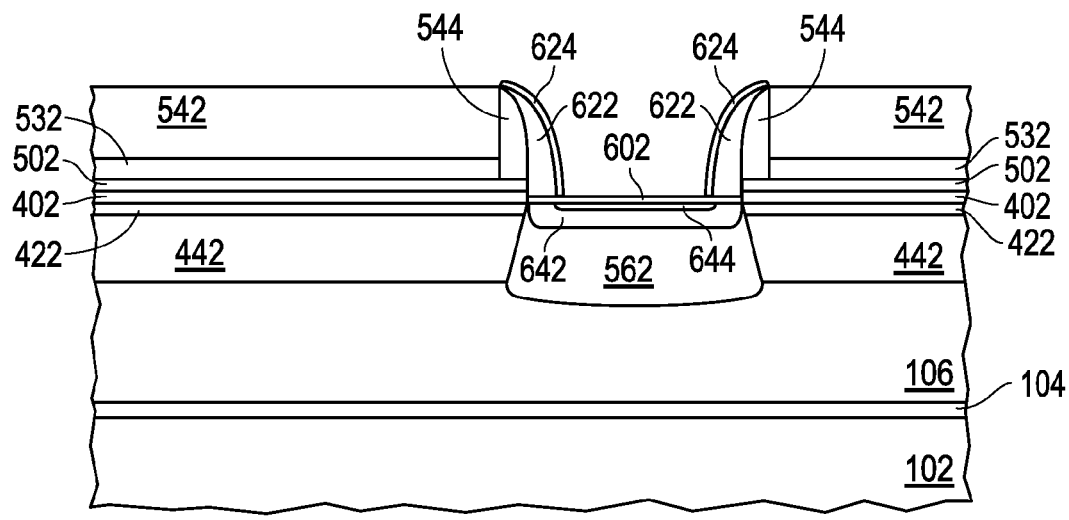

FIG. 5 includes illustrations of the workpiece after forming a gate dielectric layer 602, gate electrodes 622, an insulating layer 624 along exposed surfaces of the gate electrodes 622, body regions 642, and source regions 644. The body regions 642 may include channel regions for the transistor structures. The body regions 642 have the same conductivity type as the channel regions and the deep body doped regions 562 and can have a peak dopant concentration of at least approximately $1\times10^{18}$ atoms/cm$^3$. In another embodiment, not illustrated, channel regions for the transistor structures may be formed separately. Such channel regions can be formed by ion implantation with a dose in a range of approximately $5\times10^{12}$ ions/cm$^2$ to approximately $5\times10^{13}$ ions/cm$^2$. The energy can be selected to achieve a projected range of approximately 0.05 micron to approximately 0.3 micron.

The exposed portion of the dielectric layer 402 is removed by etching, and the gate dielectric layer 602 is formed over the exposed surface along the bottoms of the openings. In a particular embodiment, the gate dielectric layer 602 includes an oxide, a nitride, an oxynitride, or any combination thereof and has a thickness in a range of approximately 5 nm to approximately 50 nm. The gate electrodes 622 are disposed over the gate dielectric layer 602 and are spaced apart and electrically isolated from the conductive electrodes 532. The gate electrodes 622 can be formed by depositing a layer of material that is conductive as deposited or can be subsequently made conductive. The layer of material can include a metal-containing or semiconductor-containing material. In an embodiment, the layer is deposited to a thickness of approximately 0.1 micron to approximately 0.5 micron. The layer of material is etched to form the gate electrodes 622. In the illustrated embodiment, the gate electrodes 622 are formed without using a mask and have shapes of sidewall spacers. The widths of the gate electrodes 622 at their bases are substantially the same as the thickness of the layer as deposited.

The insulating layer 624 can be thermally grown from the gate electrodes 622 or may be deposited over the workpiece. The thickness of the insulating layer 624 can be in a range of approximately 10 nm to approximately 30 nm. The source regions 644 are formed from portions of the body regions 642. Each of the source regions 644 can include extension portions and a heavily doped portion. The extension portions can have a dopant concentration higher than approximately $5\times10^{17}$ atoms/cm$^3$ and less than approximately $5\times10^{19}$ atoms/cm$^3$. If needed or desired, an additional set of insulating spacers (not illustrated) may be formed before forming the heavily doped portions of the source regions 644. Such insulating spacers are formed to cover the extension portions of the source regions 644 and to displace the heavily doped portions further from the gate electrodes 622. The insulating spacers can be formed by depositing an insulating layer and anisotropically etching the insulating layer. The insulating spacers can include an oxide, a nitride, an oxynitride, or any combination thereof, and have widths at the bases of the insulating spacers in a range of approximately 50 nm to approximately 200 nm.

The doping for the heavily doped portions of the source regions 644 can be performed after the insulating layer 624 is formed. The heavily doped portions of the source regions 644 can allow ohmic contacts to be subsequently made and have a dopant concentration of at least approximately $1\times10^{19}$ atoms/cm$^3$. The source regions 644 can be formed using ion implantation, have an opposite conductivity type as compared to the body regions 642, and the same conductivity type as the horizontally-oriented doped regions 422 and the buried conductive region 102.

Figure 6:
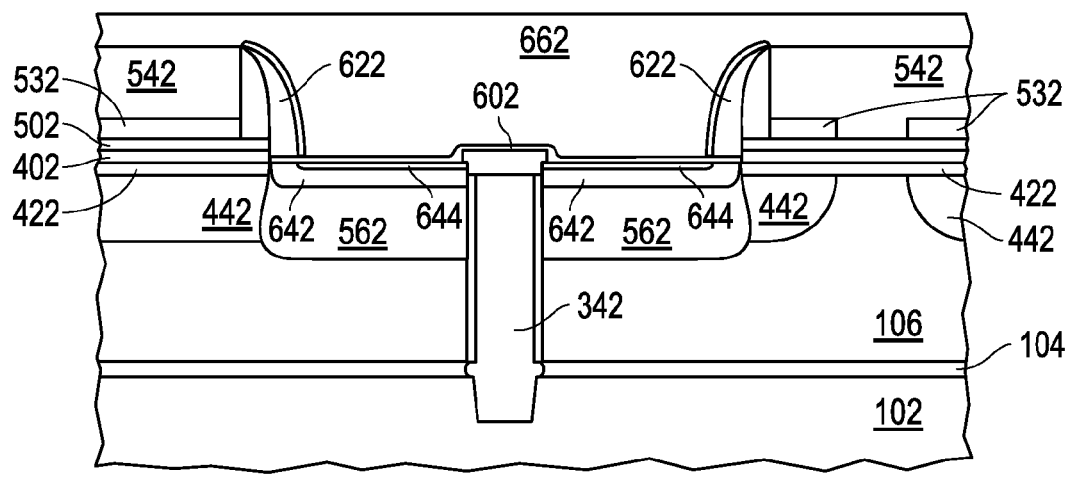
FIG. 6 includes illustrations of cross-sectional views of the workpiece of FIG. 5 after forming an ILD layer and patterning layers to define trenches.
Figure 6:
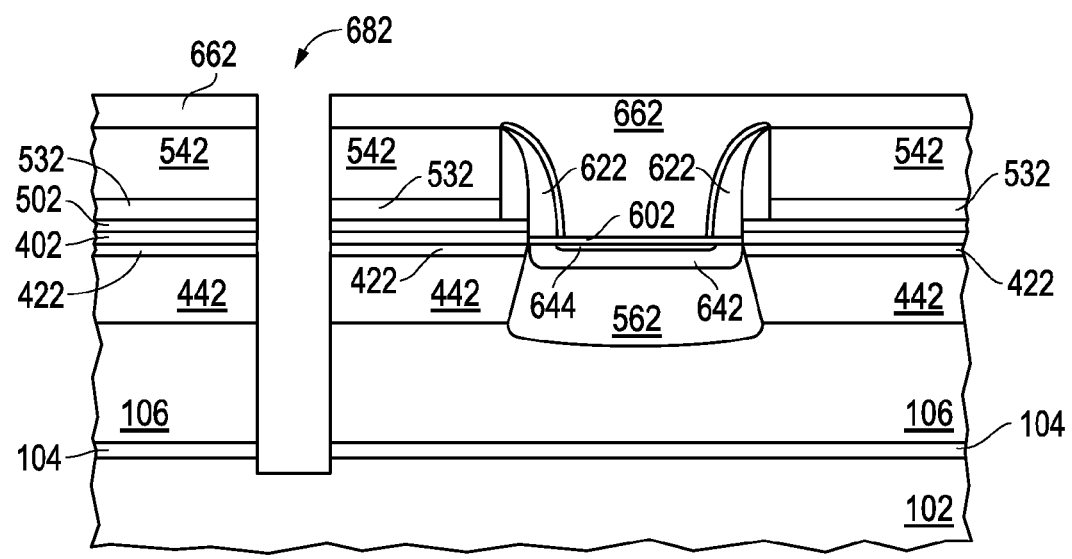

Although not illustrated in FIG. 6, processing is continued to electrically connect the vertical conductive structures 342, the body regions 642, and the source regions 644 to one another within each of the HS transistor structures. A patterned masking layer can be formed over the workpiece and define openings over the vertical conductive structure 342 and adjacent to portions of the source regions 644. Within the opening, the gate dielectric layer 602, source regions 644, and portions of the body regions 642 are etched. The bottoms of the openings may be within the body regions 642 or the deep body doped regions 562. A dopant can be implanted into the body regions 642, deep body doped regions 562, or combinations thereof to increase the dopant concentration sufficiently high enough to allow ohmic contacts to be formed.

Continuing with the embodiment, the patterned masking layer can be removed, and exposed portions of the gate dielectric layer 602 can be removed from over the source regions 644. A refractory metal can be deposited and reacted to form a metal silicide from exposed portions of silicon. The metal silicide can be formed from portions of the source regions 644, body regions 642, and the vertical conductive structures 342 (if the exposed portions include silicon), and potentially upper portions of the gate electrodes 622 if exposed. The metal silicide can be in the form of conductive straps that are adjacent to and electrically connect the source regions 644, body regions 642, and the vertical conductive structures 342 to one another. Thus, for HS transistor structures, the source regions 644 and body regions 642 can be electrically connected to the buried conductive region 102 via the vertical conductive structures 342. Additional details regarding the formation of such features can be found in US 2010/0327350, which is incorporated by reference herein for its teaching regarding conductive straps and electrically connecting source and body regions to vertical conductive structures.

The LS transistor structures may be protected during some or all of the process flow for particular embodiment described above. In a particular embodiment, upper portions of the source regions 644 and gate electrodes 622 may be silicided, but the body regions 642 of the LS transistor structures would not be exposed and would not be silicided at this point in the process.

The details of the silicidation and electrical connections of the vertical conductive structures 342, body regions 642, and source regions 644 are not illustrated for purposes of simplifying the understanding the other features in the embodiments as illustrated. Skilled artisans will appreciate that the vertical conductive structures 342, body regions 642, and source regions 644 for the HS transistor structures will be electrically connected to one another, and that other technique can be used to form such electrical connections, which can be formed at this or a later point in the process.

Figure 7:
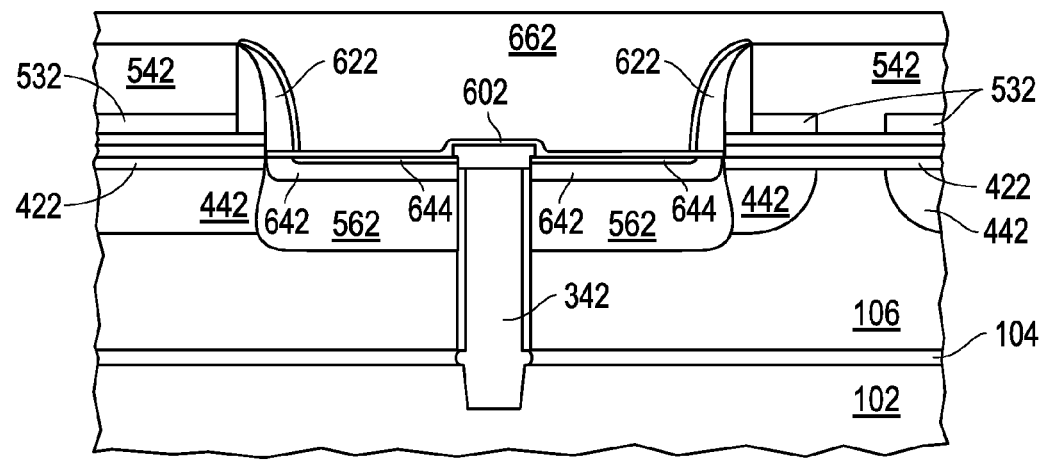
FIG. 7 includes illustrations of cross-sectional views of the workpiece of FIG. 6 after forming other vertical conductive structures within the trenches.
Figure 7:
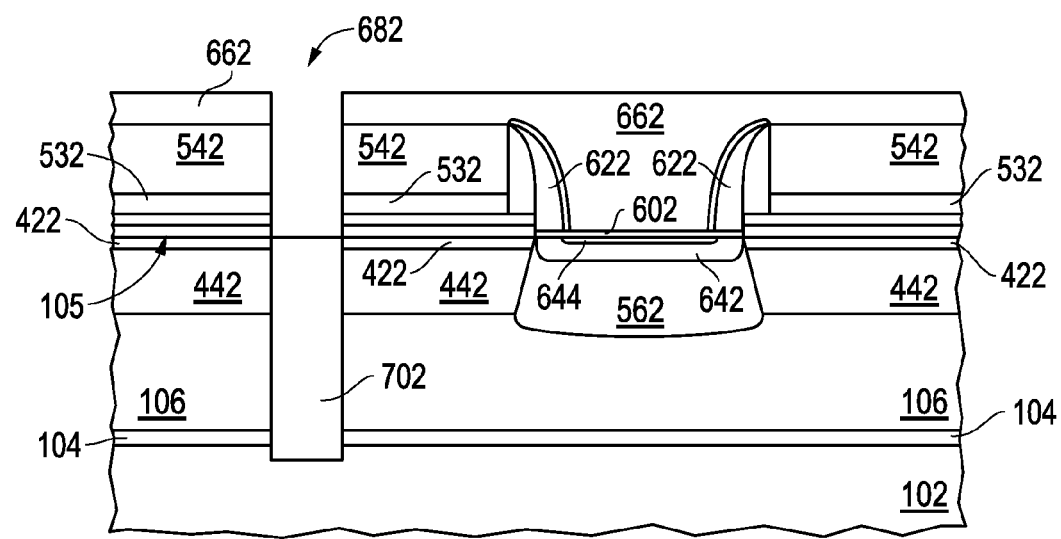

At this point in the process and as illustrated in FIGS. 6 and 7, vertical conductive structures will be formed for the LS transistor structures that electrically connect the horizontally-oriented doped regions 422 and the buried conductive regions 102 to one another. FIG. 6 includes an illustration of the workpiece after forming an interlevel dielectric (ILD) layer 662 and patterning layers to define trenches 682. The ILD layer 662 can include an oxide, a nitride, an oxynitride, an organic dielectric, or any combination thereof. The ILD layer 662 can include a single film having a substantially constant or changing composition (e.g., a high phosphorus content further from the semiconductor layer 106) or a plurality of discrete films. An etch-stop film, an antireflective film, or a combination may be used within or over the ILD layer 662 to help with processing. The ILD layer 662 can be deposited to a thickness in a range of approximately 0.5 micron to approximately 2.0 microns. The ILD layer 662 may be planarized to improve process margin during subsequent processing operations (for example, lithography, subsequent polishing, or the like).

A patterned masking layer (not illustrated) is formed over the ILD layer 662. The HS transistor structures are protected by the patterned masking layer, and therefore, none of the trenches 682 are formed in the upper illustration in FIG. 6. An opening in the patterned masking layer can be formed over portions of the workpiece where the trenches 682 to be formed. Referring to the lower illustration in FIG. 6, portions of the ILD layer 662, insulating members 542, conductive electrode 532, insulating layer 502, dielectric layer 402, horizontally-oriented doped regions 422, resurf regions 442, semiconductor layer 106, and buried insulating layer 104 are patterned to define the trenches 682 that are adjacent to the LS transistor structures. If needed or desired, the trenches 682 may extend in a range of approximately 0.2 micron to approximately 2.0 microns into the buried conductive region 102. In another embodiment, the trenches 682 may be deeper or shallower than described above. In a further embodiment, the buried insulating layer 104 may not be present. The trenches 682 may extend completely or only partly to the buried conductive region 102. If the trenches 682 extend only partly, and not completely, to the buried conductive region 102, bottoms of the trenches 682 may be doped to ensure portions of the semiconductor layer 106 along the bottoms of the trenches are electrically connected to the buried conductive region 102.

Referring to FIG. 6, the trenches 682 have widths such that a subsequently-formed conductive layer substantially completely fills the trenches 682. In one embodiment, the trenches 682 can have a width of at least approximately 0.5 micron, and in another embodiment, the trenches 682 can have a width of at least approximately 0.8 micron. In an embodiment, the trenches 682 may be no greater than 3.0 microns, and in another embodiment, the trenches 682 may be no greater than approximately 2.5 microns. In a particular embodiment, the trenches 682 have widths in a range of approximately 1.1 microns to approximately 2.0 microns.

FIG. 7 includes illustrations after vertical conductive structures 702 are formed. The vertical conductive structures 702 can electrically connect the horizontally-oriented doped regions 422 and the buried conductive region 102 to one another. The horizontally-oriented doped regions 422 are at least part of the drain regions for the transistor structures being formed. Thus, the vertical conductive structures 702 electrically connect buried conductive region 102 and the drain regions of the LS transistor structures to each other. Further, the vertical conductive structures 342 electrically connect buried conductive region 102 and the source regions 644 of the HS transistor structures to each other. Therefore, the drain regions of the LS transistor structures and the source regions 644 of the HS transistor structures are electrically connected to each other via the vertical conductive structures 342 and 702 and the buried conductive region 102. The buried conductive region 102 can be electrically connected to an output terminal for the switching circuit.

The vertical conductive structures 702 can be formed from a conductive layer that is formed over the ILD layer 662 and within the trenches 682. In a particular embodiment, the conductive layer substantially completely fills the trenches 682. The conductive layer can include a metal-containing or semiconductor-containing material. In an embodiment, the conductive layer can include a heavily doped semiconductor material, such as amorphous silicon or polysilicon. In another embodiment, the conductive layer includes a plurality of films, such as an adhesion film, a barrier film, and a conductive fill material. In a particular embodiment, the adhesion film can include a refractory metal, such as titanium, tantalum, tungsten, or the like; the barrier film can include a refractory metal nitride, such as titanium nitride, tantalum nitride, tungsten nitride, or the like, or a refractory metal-semiconductor-nitride, such as TaSiN; and the conductive fill material can include tungsten or tungsten silicide. In a more particular embodiment, the conductive layer can include Ti/TiN/W. The selection of the number of films and composition(s) of those film(s) depends on electrical performance, the temperature of a subsequent heat cycle, another criterion, or any combination thereof. Refractory metals and refractory metal-containing compounds can withstand high temperatures (e.g., melting points of the refractory metals can be at least 1400° C.), may be conformally deposited, and have a lower bulk resistivity than heavily doped n-type silicon. After reading this specification, skilled artisans will be able to determine the composition of the conductive layer to meet their needs or desires for a particular application. The conductive layer used to form the vertical conductive structures 702 may have substantially no voids or, if they have any voids, such voids may be smaller than voids in the vertical conductive structures 342. If any of the vertical conductive structures 702 has voids at an elevation corresponding to the buried insulating layer 104, voids at a corresponding location within the vertical conductive structures 342 can be larger than each of such void(s) in the vertical conductive structures 702.

The portion of the conductive layer that is disposed over the ILD layer 662 is removed. The removal can be performed using a chemical-mechanical polishing or blanket etching technique. An etch or other removal operation is performed to recess the conductive layer further into the trenches 682 to form vertical conductive structures 702. The uppermost elevations of the vertical conductive structures 702 lie at least at the lowest elevations of the horizontally-oriented doped regions 422 immediately adjacent to the trenches 682. As the uppermost elevations of the vertical conductive structures 702 extend to elevations higher than the horizontally-oriented doped regions 422, parasitic capacitive coupling to the conductive electrodes 532 may become significant. In a particular embodiment, the vertical conductive structures 702 may extend to an elevation no higher than the primary surface 105. None of the vertical conductive structures 702 are covered by the conductive electrodes 532. From a top view, the vertical conductive structures 702 can be between immediately adjacent pairs of conductive electrodes 532.

The vertical conductive structures 702 are examples of vertical conductive regions. In another embodiment, a different type of vertical conductive region may be used. For example, in an embodiment in which the buried insulating layer 104 is not present, the vertical conductive regions may be the vertical conductive structures 702 or may be formed by doping portions of the horizontally-oriented doped regions 422, resurf regions 442 and semiconductor layer 106 to form heavily doped regions extending from the horizontally-oriented doped regions 422 to the buried conductive region 102. The heavily doped regions have the same conductivity type as the horizontally-oriented doped regions 422 and can have a shape similar to the vertical conductive structures 702. The heavily doped regions may be formed using different implants at different energies, so that a relatively low resistance connection is made between the horizontally-oriented doped regions 422 and the buried conductive region 102. When the vertical conductive structures are replaced by the heavily doped regions, the heavily doped regions may be formed earlier in the process flow.

Figure 8:
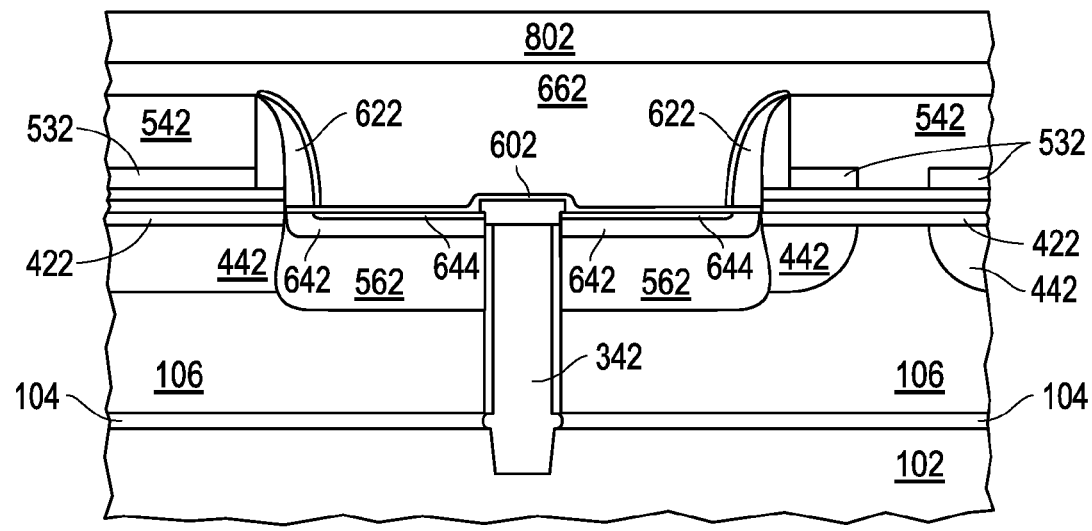
FIG. 8 includes illustrations of cross-sectional views of the workpiece of FIG. 7 after forming another ILD layer.
Figure 8:
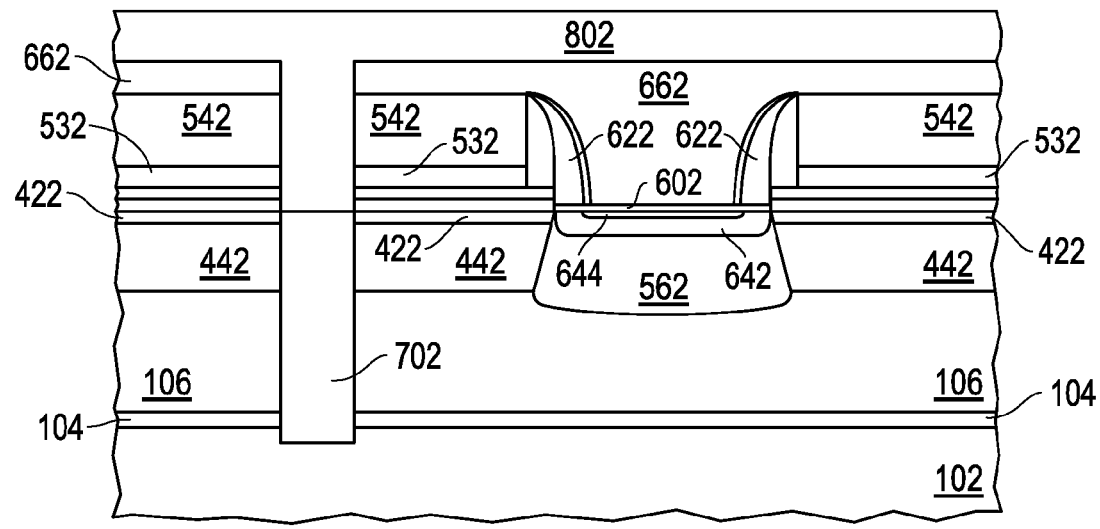

FIG. 8 includes illustrations of the workpiece after forming an ILD layer 802. The ILD layer 802 is formed over the vertical conductive structure 702 and substantially completely fills remaining portions of the trenches 682 (labeled in FIG. 7). The ILD layer 802 can include any of the materials, films, and thicknesses as previously described with respect to the ILD layer 662. The ILD layer 802 can have the same or different materials, films, and thicknesses as compared to the ILD layer 662. The ILD layer 802 can be planarized. In the embodiment as illustrated in FIG. 8, a portion of the ILD layer 802 overlies the ILD layer 662. In another embodiment (not illustrated), substantially all of the ILD layer 802 overlying the ILD layer 662 may be removed.

Figure 9:
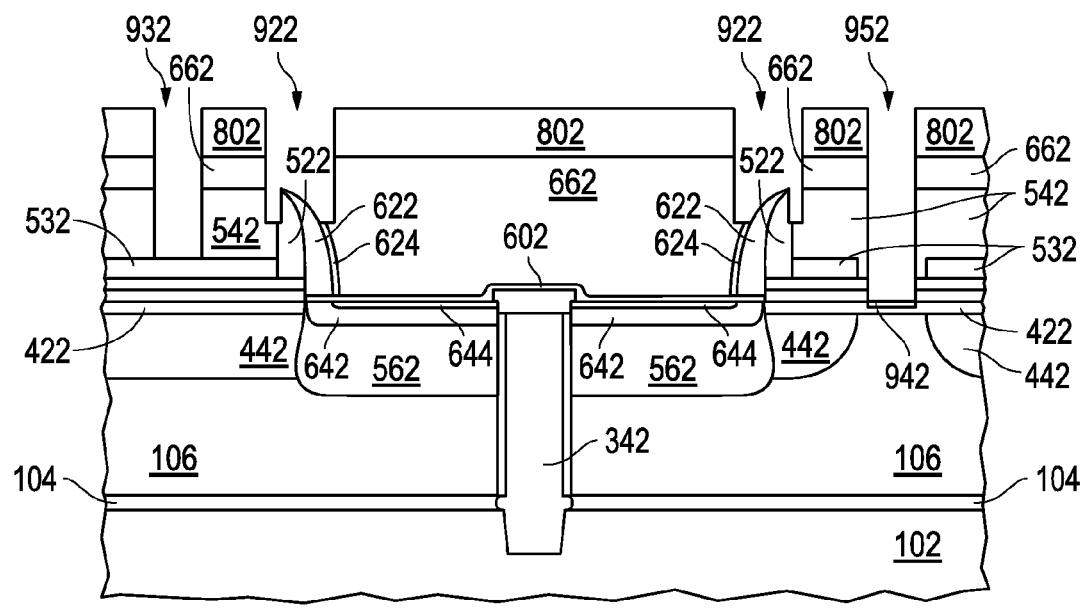
FIG. 9 includes illustrations of cross-sectional views of the workpiece of FIG. 8 after patterning layers to define contact openings that expose the gate electrodes, conductive electrode members, horizontally-oriented doped regions, and heavily doped regions along bottoms of the openings to the horizontally-oriented doped regions.
Figure 9:
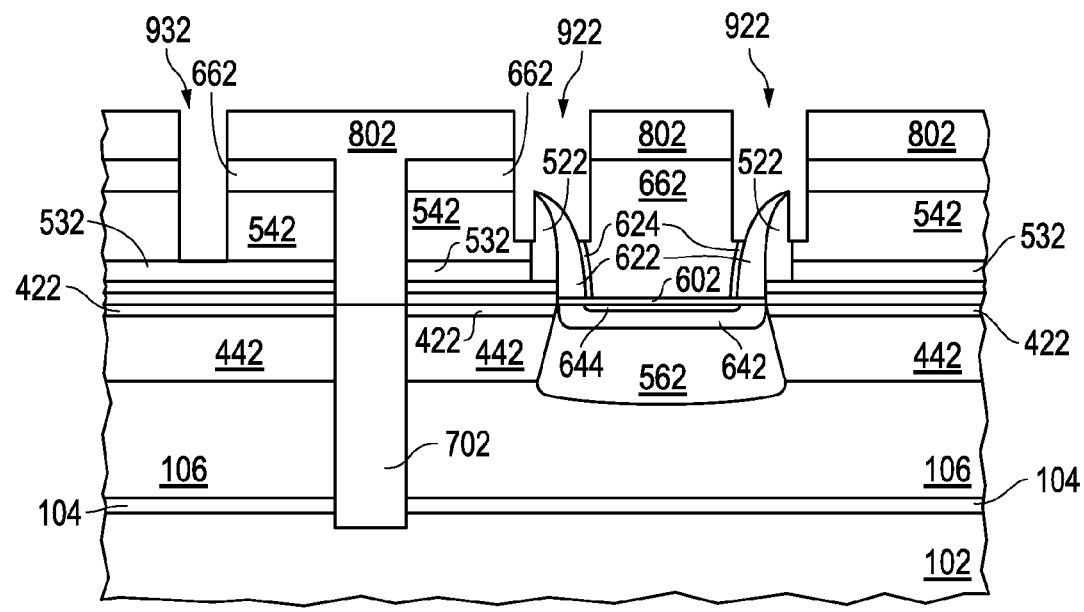

A patterned masking layer (not illustrated) is formed over the workpiece and defines openings under which contact openings will be subsequently formed. In the embodiment as illustrated in FIG. 9, the ILD layers 802 and 662, the insulating members 542, insulating layer 624 and insulating spacers 522 are patterned to define contact openings including openings 922 to the gate electrodes 622, openings 932 to the conductive electrodes 532, and an openings 952 to the horizontally-oriented doped regions 422 that are at least parts of drain regions for the HS transistors structures. The bottoms of the openings 952 can be doped to form heavily doped regions 942, which allow ohmic contacts to be formed to the horizontally-oriented doped regions 422. The heavily doped regions 942 have the same conductivity type as the horizontally-oriented doped regions 422 and a dopant concentration of at least $1 \times 10^{19}$ atoms/cm$^3$.

Figure 10:
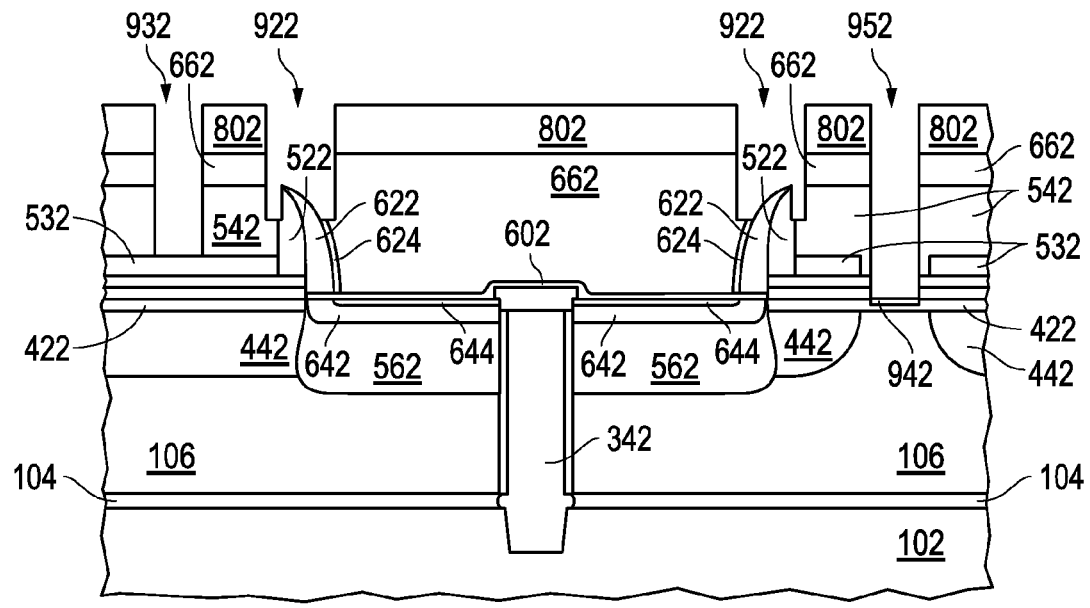
FIG. 10 includes illustrations of cross-sectional views of the workpiece of FIG. 9 after patterning layers to define openings to the body regions and forming heavily doped regions along bottoms of the openings to the body regions.
Figure 10:
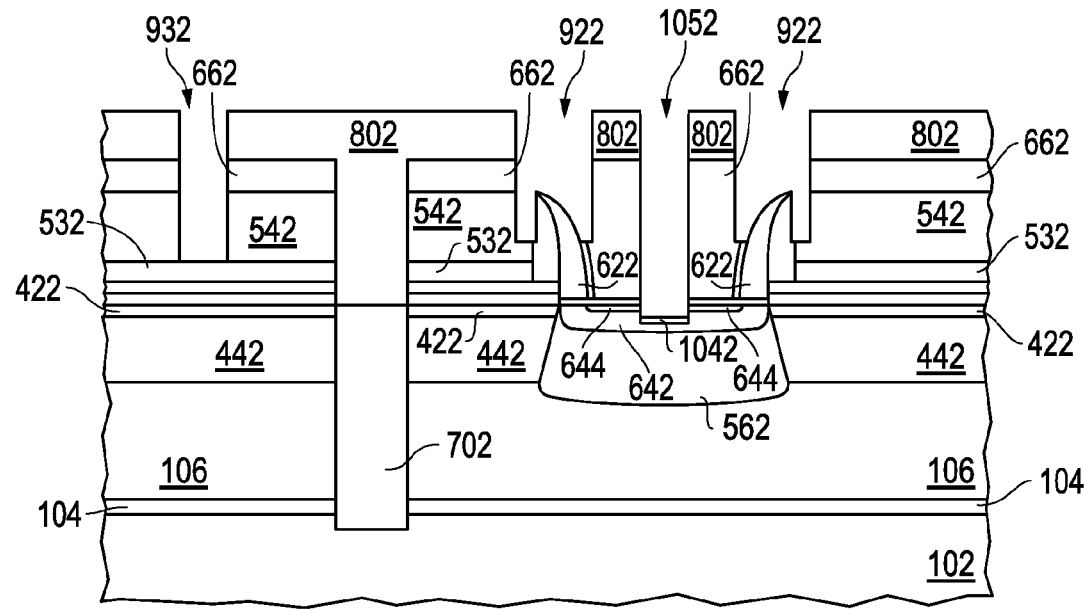

FIG. 10 includes illustrations of the workpiece after patterning layers to define openings 1052 and forming doped regions 1042. The openings 1052 allow source/body contacts for the LS transistor structures to be made. The ILD layers 802 and 662, and the gate dielectric layer 602 can be patterned to define the openings 1052. The openings 1052 extend through the source regions 644 to the body regions 642. In another embodiment, the openings 1052 may extend through the body regions 642 to the deep body doped regions 562. The bottoms of the openings 1052 can be doped to form heavily doped regions 1042, which allow ohmic contacts to be formed to the body regions 642. The heavily doped regions 1042 have the same conductivity type as body regions 642 and a dopant concentration of at least $1 \times 10^{19}$ atoms/cm$^3$.

In an embodiment, after forming the openings 1052, a sacrificial layer (not illustrated) may be formed along exposed portions of source regions 644 to reduce the likelihood of counterdoping of such regions. If needed or desired, the sacrificial layer may be anisotropically etched along the bottom of the openings 1052. The heavily doped regions 1042 may be formed by ion implantation or another suitable doping technique. The workpiece may be annealed to activate the dopants introduced into the workpiece during the contact opening process sequence. After doping and anneal, the sacrificial layer is removed to expose portions of the source regions 644.

Figure 11:
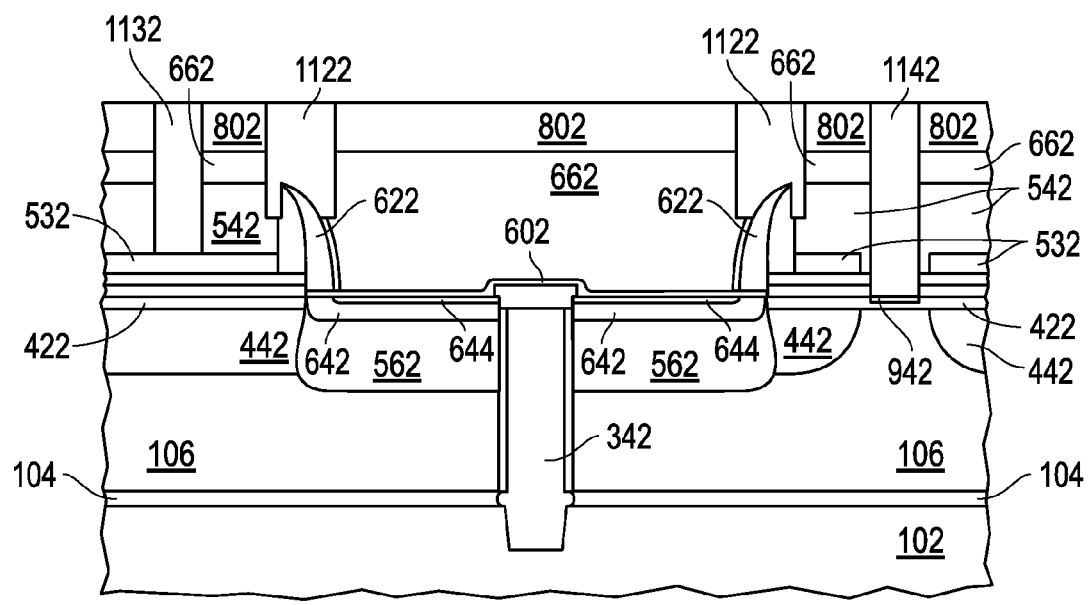
FIG. 11 includes illustrations of cross-sectional views of the workpiece of FIG. 10 after forming conductive plugs.
Figure 11:
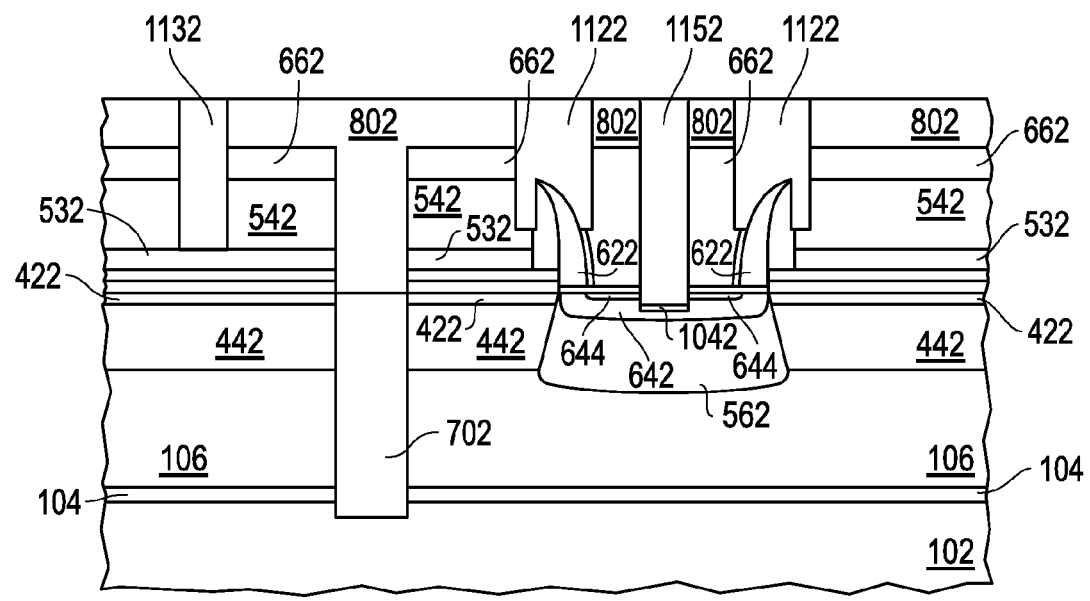

FIG. 11 includes illustrations after forming conductive plugs 1122, 1132, 1142, and 1152. The conductive plugs 1122 are electrically connected to the gate electrodes 622 of the transistor structures, the conductive plugs 1132 are electrically connected to the conductive electrodes 532, the conductive plugs 1142 are electrically connected to the heavily doped regions 942, and the conductive plugs 1152 are electrically connected to the source regions 644. In an embodiment, none of the conductive plugs within the ILD layer 802 is electrically connected to the vertical conductive structures 342 and 702.

In an embodiment, the conductive plugs 1122, 1132, 1142, and 1152 can be formed using a plurality of films. In an embodiment, a layer including a refractory metal, such as Ti, Ta, W, Co, Pt, or the like, can be deposited over the workpiece and within the openings 922, 932, 952, and 1052 (labeled in FIG. 10). If needed or desired, a layer including a metal nitride layer can be deposited over the layer including the refractory metal. The workpiece can be annealed so that portions of the layer including the refractory metal are selectively reacted with exposed silicon, such as substantially monocrystalline or polycrystalline silicon, to form a metal silicide. Thus, portions of the gate electrodes 622, conductive electrodes 532, source regions 644, horizontally-oriented doped regions 422, body regions 642, and heavily doped regions 942 and 1042 can react with the metal within the layer that includes the refractory metal to form a metal silicide. Portions of the layer that include the refractory metal that contact an insulating layer do not react. A metal nitride layer may be formed to further fill a part, but not the remainder of the openings. The metal nitride layer and can act as a barrier layer. A layer of a conductive material fills the remainder of the contact openings 922, 934, 952, and 1052. Portions of the layer including the refractory metal, the metal nitride layer and the conductive material that overlies the ILD layer 802 are removed to form the conductive plugs 1122, 1132, 1142, and 1152.

Figure 12:
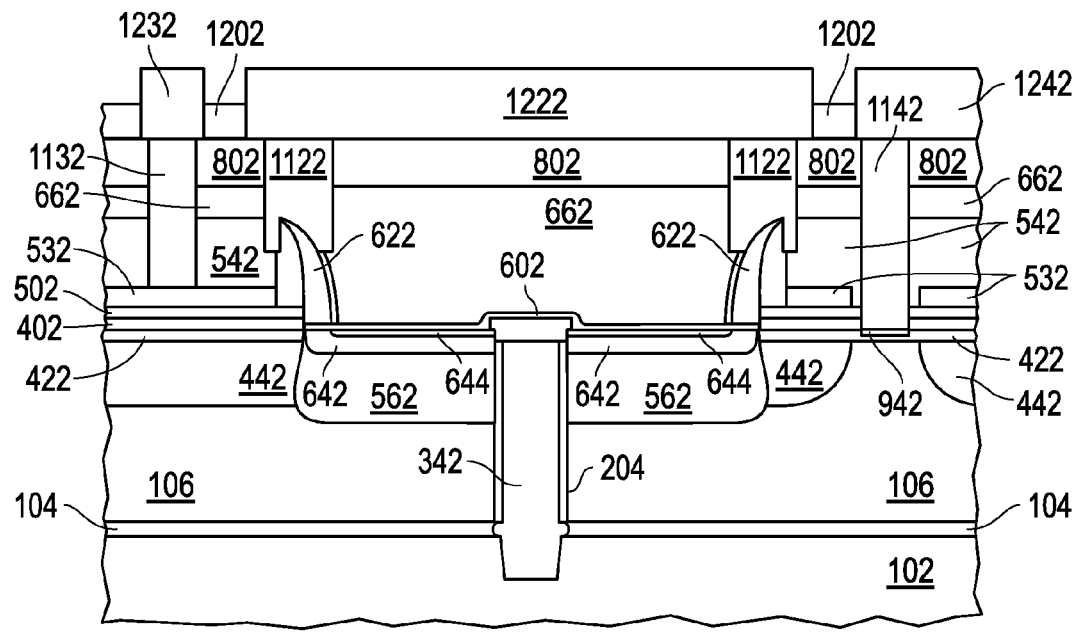
FIG. 12 includes illustrations of cross-sectional views of the workpiece of FIG. 11 after forming a first level of interconnects for the transistor structures.
Figure 12:
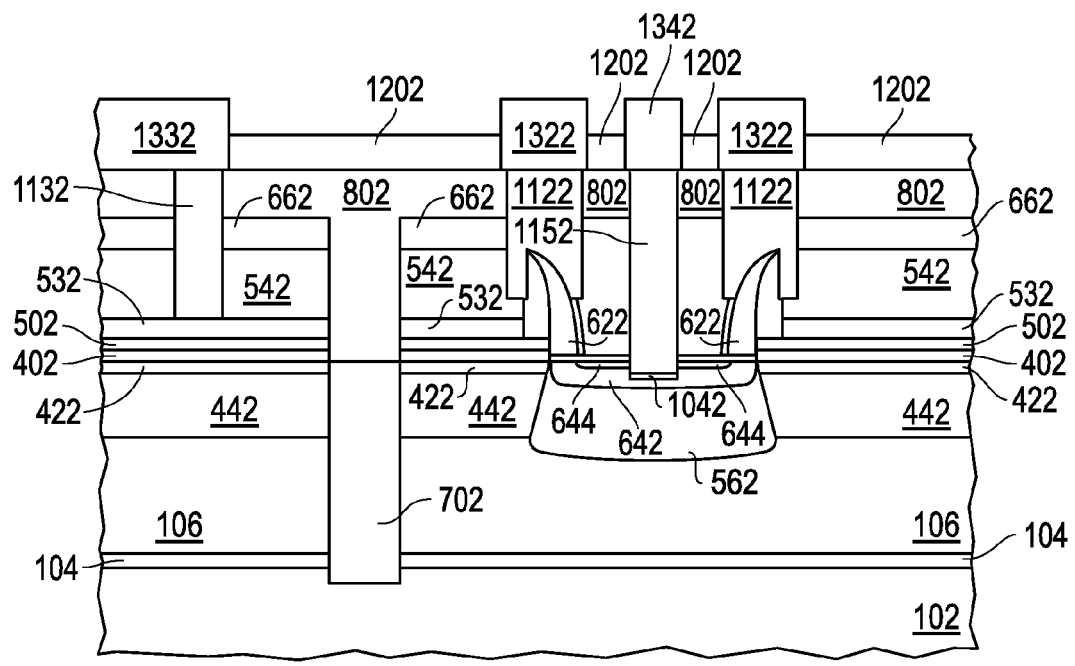

FIG. 12 includes illustrations of the workpiece after a first level of interconnects is formed. The ILD layer 1202 can include any of the compositions as previously described with respect to the ILD layer 662. The ILD layer 1202 can have substantially the same composition or a different composition as compared to the ILD layer 662. The ILD layer 1202 is patterned to define via openings.

Interconnects 1222, 1232, 1242, 1322, 1332, and 1342 are formed that extend at least partly within the openings within the ILD layer 1202. The interconnects 1222 and 1322 are electrically connected to the conductive plugs 1122 and the gate electrodes 622. The interconnects 1232 and 1332 are electrically connected to the conductive plugs 1132 and the conductive electrodes 532. The interconnects 1242 are electrically connected to the conductive plugs 1142 and horizontally-oriented doped regions 422 of the HS transistor structures. The interconnects 1342 are electrically connected to the conductive plugs 1152, source regions 644, and body regions 642 of the LS transistor structures. In an embodiment, the interconnects 1242 are electrically connected to a power supply terminal, such as $V_D$, and the interconnects 1342 are electrically connected to a power supply terminal, such as $V_S$.

The interconnects 1222 may be parts of the same interconnect or may be different interconnects that are electrically connected at a different level of interconnects. The interconnects 1322 may be parts of the same interconnect or may be different interconnects that are electrically connected at a different level of interconnects. The interconnects 1222 may not be electrically connected to the interconnects 1322, so that the HS transistor structures may be controlled independently of the LS transistor structures.

In the upper illustration of FIG. 12, the conductive electrodes 532 and the source regions 644 are electrically connected to each other. The interconnect 1232 can be electrically connected to the buried conductive region 102 at a location not illustrated in FIG. 12. In the lower illustration of FIG. 12, the conductive electrodes 532 and the source regions 644 are electrically connected to each other. The interconnects 1332 and 1342 may be electrically connected to each other. In a particular embodiment, the interconnects 1332, and 1342 are electrically connected to one another and to a power supply terminal, such as $V_S$. In another particular embodiment, the interconnects 1232 are not electrically connected to the interconnects 1332, 1342, or any combination thereof.

Although not illustrated, additional or fewer layers or features may be used as needed or desired to form the electronic device. Field isolation regions are not illustrated but may be used to help electrically isolate portions of the power transistor. In another embodiment, more insulating and interconnect levels may be used. A passivation layer can be formed over the workpiece or within the interconnect levels. After reading this specification, skilled artisans will be able to determine layers and features for their particular application.

The electronic device can include many other transistor structures that are substantially identical to the transistor structures as illustrated in FIG. 12. For example, the transistor structures substantially similar to the transistor structure in the upper illustration of FIG. 12 can be connected in parallel with each other to form the transistor, such as a high-side transistor, and the transistor structures substantially similar to the transistor structure in the lower illustration of FIG. 12 can be connected in parallel with each other to form the transistor, such as a low-side transistor. Such a configuration can give a sufficient effective channel width of the electronic device that can support the relatively high current flow that is used during normal operation of the electronic device.

In still another embodiment, one or more bipolar transistors may be used instead of the field-effect transistors. In this embodiment, current carrying electrodes can include emitter regions and collector regions instead of the source regions and drain regions, and control electrodes can include base regions instead of gate electrodes. If a buried collector is used, the buried collector can be patterned to allow a properly isolated connection to be made to the buried conductive region 102.

The embodiments as described herein can allow for the use of different vertical conductive structures that are well suited for different components within an electronic device that are to operate a different voltages, electrical fields, currents, current densities, or the like. The vertical conductive structure 342 is formed relatively early in the process flow and is surrounded by insulating spacers 204 that can help to keep current flowing through the vertical conductive structures 342. The vertical conductive structure 702 does not have insulating spacers surrounding them. The vertical conductive structures 702 can be formed later in a process because a thermal oxidation is not performed to insulate the vertical conductive structures 702.

When comparing the vertical conductive structures 342 and 702, more of the buried insulating layer 104 may be removed when forming the vertical conductive structures 342 as compared when forming the vertical conductive structures 702. In a particular embodiment, portions of the vertical conductive structures 342 lie at the same elevation as the buried insulating layer 104 and have maximum widths, and other portions lie at an elevation above the buried insulating layer 104 and have minimum width. Portions of the vertical conductive structure 702 lie at the same elevation as the buried insulating layer 104 and have maximum widths, and other portions lie at an elevation above the buried insulating layer 104 and have minimum widths. The ratio of the maximum widths to the minimum widths for the vertical conductive structures 342 is greater that the ratio of the maximum widths to the minimum widths for the vertical conductive structures 702.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the items as listed below.

Item 1. An electronic device can include a buried conductive region and a semiconductor layer having a primary surface and an opposing surface, wherein the buried conductive region is disposed closer to the opposing surface than to the primary surface. The electronic device can further include a first vertical conductive region adjacent to the primary surface and extending though the semiconductor layer toward the buried conductive region, wherein the first vertical conductive region is electrically connected to the buried conductive region; and an insulating layer disposed between the semiconductor layer and the first vertical conductive region at a first point within the semiconductor layer that is closer to the buried conductive region as compared to the primary surface. The electronic device can still further include a second vertical conductive region adjacent to the primary surface and extending though the semiconductor layer toward the buried conductive region, wherein the second vertical conductive region is electrically connected to the buried conductive region, and wherein no insulating layer is disposed between the semiconductor layer and the second vertical conductive region at a second point within the semiconductor layer that is closer to the buried conductive region as compared to the primary surface.

Item 2. The electronic device of Item 1, wherein the semiconductor layer defines a trench, and the second vertical conductive region includes a vertical conductive structure that is disposed within the trench and abuts the semiconductor layer.

Item 3. The electronic device of Item 1, wherein the first vertical conductive region and the second vertical conductive region have different compositions.

Item 4. The electronic device of Item 1, further including a first transistor structure and a second transistor structure spaced apart from the first transistor structure, wherein the first and second transistor structures are coupled to each other via the first vertical conductive region, the buried conductive region, and the second conductive region.

Item 5. The electronic device of Item 4, further including the first transistor structure includes a first source region, wherein the first vertical conductive region electrically connects the first source region and the buried conductive region to each other; and the second transistor structure includes a second drain region, wherein the second vertical conductive region electrically connects the second drain region and the buried conductive region to each other.

Item 6. The electronic device of Item 5, further including a first conductive electrode overlying the first drain region, a second conductive electrode overlying the second drain region, or both.

Item 7. The electronic device of claim 6, wherein the second transistor structure further comprises a second source region. The first conductive structure is electrically connected to the first source region, the second conductive electrode is electrically connected to the second source region, or both.

Item 8. The electronic device of Item 6, wherein the first transistor structure further includes a first gate electrode, the second transistor structure further includes a second gate electrode, and each of the first conductive electrode and second conductive electrode are electrically isolated from the first gate electrode and the second gate electrode.

Item 9. An electronic device can include a buried conductive region, a buried insulating layer over the buried conductive region, and a semiconductor layer disposed over the buried insulating layer, wherein the semiconductor layer has a primary surface and an opposing surface, and the buried conductive region is disposed closer to the opposing surface than to the primary surface. The electronic device can further include a first vertical conductive structure extending through the buried insulating layer, wherein the first vertical conductive structure is electrically connected to the buried conductive region. The electronic device can still further include a second vertical conductive structure extending through the buried insulating layer, wherein the second vertical conductive structure is electrically connected to the buried conductive region.

In an embodiment of Item 9, the first vertical conductive structure defines a first void disposed adjacent to the buried insulating layer, the second vertical conductive structure does not define a void adjacent to the buried insulating layer or defines at least one second void adjacent to the buried insulating layer, wherein the first void is larger than each of the at least one second void.

In another embodiment of Item 9, portions of the first and second vertical conductive structures are characterized such that a portion of the first vertical conductive structure lies at a same elevation as the buried insulating layer and has a first maximum width, another portion of the first vertical conductive structure lies at an elevation above the buried insulating layer and has a first minimum width, and a first ratio is the first maximum width to the first minimum width; a portion of the second vertical conductive structure lies at the same elevation as the buried insulating layer and has a second maximum width, another portion of the second vertical conductive structure lies at the elevation above the buried insulating layer and has a second minimum width; a second ratio is the first maximum width to the second minimum width; and the first ratio is greater than the second ratio.

Item 10. The electronic device of Item 9, wherein the first vertical conductive structure defines a first void disposed adjacent to the buried insulating layer, the second vertical conductive structure does not define a void adjacent to the buried insulating layer or defines at least one second void adjacent to the buried insulating layer, wherein the first void is larger than each of the at least one second void.

Item 11. The electronic device of Item 9, wherein a portion of the first vertical conductive structure lies at a same elevation as the buried insulating layer and has a first maximum width, another portion of the first vertical conductive structure lies at an elevation above the buried insulating layer and has a first minimum width, and a first ratio is the first maximum width to the first minimum width; a portion of the second vertical conductive structure lies at the same elevation as the buried insulating layer and has a second maximum width, another portion of the second vertical conductive structure lies at the elevation above the buried insulating layer and has a second minimum width; a second ratio is the first maximum width to the second minimum width; and the first ratio is greater than the second ratio.

Item 12. The electronic device of Item 9, further including a horizontally-oriented doped region adjacent to the primary surface, wherein the second vertical conductive structure electrically connects the horizontally-oriented doped region and the buried conductive region to each other.

Item 13. A process of forming an electronic device can include providing a workpiece including buried conductive region and a semiconductor layer over the buried conductive region, wherein the semiconductor layer has a primary surface and an opposing surface, wherein the buried conductive region is disposed closer to the opposing surface than to the primary surface. The process can further include forming a first vertical conductive region adjacent to the primary surface and extending though the semiconductor layer toward the buried conductive region; and forming a second vertical conductive region adjacent to the primary surface and extending though the semiconductor layer toward the buried conductive region, wherein forming a second vertical conductive region is performed at a different time as compared to forming the first vertical conductive region.

Item 14. The process of Item 13, further including forming a gate electrode and forming a source region. Forming the gate electrode, forming the source region, or forming both are performed after forming the first vertical conductive region; and forming the second vertical conductive region is performed after forming the gate electrode, forming the source region, or both.

Item 15. The process of Item 14, wherein forming the gate electrode and forming the source region are performed after forming the first vertical conductive region, and forming the second vertical conductive region is performed after forming the gate electrode and forming the source region.

Item 16. The process of Item 13, further including forming a conductive electrode over the semiconductor layer, wherein forming the conductive electrode is performed after forming the first vertical conductive region, and forming the second vertical conductive region is performed after forming the conductive electrode.

Item 17. The process of Item 13, wherein the semiconductor layer defines a trench having a sidewall, and forming the second vertical conductive region includes forming a conductive layer within the trench and abutting the sidewall.

Item 18. The process of Item 17, wherein the semiconductor layer defines another trench having another sidewall, the process further includes forming an insulating layer along a portion of the other sidewall, and forming the first vertical conductive region includes forming another conductive layer within the other trench, wherein the insulating layer is disposed between other the conductive layer and the semiconductor layer.

Item 19. The process of Item 13, further including forming a conductive electrode after forming the first vertical conductive region, wherein forming the second vertical conductive region is performed after forming the conductive electrode.

Item 20. The process of Item 19, further including forming a gate electrode after forming the conductive electrode.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device comprising:
a buried conductive region;
a semiconductor layer having a primary surface and an opposing surface, wherein the buried conductive region is disposed closer to the opposing surface than to the primary surface;
a first vertical conductive region adjacent to the primary surface and extending through the semiconductor layer toward the buried conductive region, wherein the first vertical conductive region is electrically connected to the buried conductive region;
an insulating layer disposed between the semiconductor layer and the first vertical conductive region at a first point within the semiconductor layer that is closer to the buried conductive region as compared to the primary surface;
a second vertical conductive region adjacent to the primary surface and extending through the semiconductor layer toward the buried conductive region, wherein the second vertical conductive region is electrically connected to the buried conductive region, and wherein no insulating layer is disposed between the semiconductor layer and the second vertical conductive region at a second point within the semiconductor layer that is closer to the buried conductive region as compared to the primary surface; and
a first transistor structure and a second transistor structure spaced apart from the first transistor structure, wherein the first and second transistor structures are coupled to each other via the first vertical conductive region, the buried conductive region, and the second vertical conductive region.

2. The electronic device of claim 1, wherein:
the semiconductor layer defines a trench; and
the second vertical conductive region comprises a vertical conductive structure that is disposed within the trench and abuts the semiconductor layer.

3. The electronic device of claim 1, wherein the first vertical conductive region and the second vertical conductive region have different compositions.

4. The electronic device of claim 1, further comprising:
the first transistor structure comprises a first source region, wherein the first vertical conductive region electrically connects the first source region and the buried conductive region to each other; and
the second transistor structure comprises a second drain region, wherein the second vertical conductive region electrically connects the second drain region and the buried conductive region to each other.

5. The electronic device of claim 4, further comprising:
a first conductive electrode overlying the first source region; or
a second conductive electrode overlying the second drain region.

6. The electronic device of claim 5, wherein the second transistor structure further comprises a second source region, wherein:
the first conductive structure is electrically connected to the first source region; or
the second conductive electrode is electrically connected to the second source region.

7. The electronic device of claim 5, wherein:
the first transistor structure further comprises a first gate electrode;
the second transistor structure further comprises a second gate electrode; and
each of the first conductive electrode and second conductive electrode are electrically isolated from the first gate electrode and the second gate electrode.

8. An electronic device comprising:
a buried conductive region;
a buried insulating layer over the buried conductive region;
a semiconductor layer disposed over the buried insulating layer, wherein the semiconductor layer has a primary surface and an opposing surface, and the buried conductive region is disposed closer to the opposing surface than to the primary surface;

a first vertical conductive structure extending through the buried insulating layer, wherein the first vertical conductive structure is electrically connected to the buried conductive region; and a second vertical conductive structure extending through the buried insulating layer, wherein the second vertical conductive structure is electrically connected to the buried conductive region, wherein the first vertical conductive structure defines a first void disposed adjacent to the buried insulating layer, the second vertical conductive structure does not define a void adjacent to the buried insulating layer or defines at least one second void adjacent to the buried insulating layer, wherein the first void is larger than each of the at least one second void.

9. The electronic device of claim 8, wherein:

a portion of the first vertical conductive structure lies at a same elevation as the buried insulating layer and has a first maximum width, another portion of the first vertical conductive structure lies at an elevation above the buried insulating layer and has a first minimum width, and a first ratio is the first maximum width to the first minimum width;

a portion of the second vertical conductive structure lies at the same elevation as the buried insulating layer and has a second maximum width, another portion of the second vertical conductive structure lies at the elevation above the buried insulating layer and has a second minimum width;

a second ratio is the second maximum width to the second minimum width; and the first ratio is grater than the second ratio.

10. The electronic device of claim 8, further comprising a horizontally-oriented doped region adjacent to the primary surface, wherein the second vertical conductive structure electrically connects the horizontally-oriented doped region and the buried conductive region to each other.

11. A process of forming an electronic device comprising:

providing a workpiece including buried conductive region and a semiconductor layer over the buried conductive region, wherein the semiconductor layer has a primary surface and an opposing surface, wherein the buried conductive region is disposed closer to the opposing surface than to the primary surface;

forming a first vertical conductive region adjacent to the primary surface and extending through the semiconductor layer toward the buried conductive region;

forming a second vertical conductive region adjacent to the primary surface and extending through the semiconductor layer toward the buried conductive region, wherein forming a second vertical conductive region is performed at a different time as compared to forming the first vertical conductive region;

forming a gate electrode; and forming a source region, wherein:

forming the gate electrode, forming the source region, or forming both are performed after forming the first vertical conductive region; and forming the second vertical conductive region is performed after forming the gate electrode, forming the source region, or both.

12. The process of claim 11, wherein:

forming the gate electrode and forming the source region are performed after forming the first vertical conductive region; and forming the second vertical conductive region is performed after forming the gate electrode and forming the source region.

13. The process of claim 11, further comprising forming a conductive electrode over the semiconductor layer, wherein forming the conductive electrode is performed after forming the first vertical conductive region, and forming the second vertical conductive region is performed after forming the conductive electrode.

14. The process of claim 11, wherein:

the semiconductor layer defines a trench having a sidewall; and forming the second vertical conductive region comprises forming a conductive layer within the trench and abutting the sidewall.

15. The process of claim 14, wherein:

the semiconductor layer defines another trench having another sidewall;

the process further comprises forming an insulating layer along a portion of the other sidewall; and forming the first vertical conductive region comprises forming another conductive layer within the other trench, wherein the insulating layer is disposed between other the conductive layer and the semiconductor layer.

16. The process of claim 11, further comprising forming a conductive electrode after forming the first vertical conductive region, wherein forming the second vertical conductive region is performed after forming the conductive electrode.

17. The process of claim 16, wherein forming the gate electrode is performed after forming the conductive electrode.

* * * * *